(12) United States Patent
Wong et al.

(10) Patent No.: US 7,130,604 B1
(45) Date of Patent: Oct. 31, 2006

(54) HARMONIC REJECTION MIXER AND METHOD OF OPERATION

(75) Inventors: Hee Wong, San Jose, CA (US);
Shu-Ing Ju, Palo Alto, CA (US);
Michael Schwartz, San Jose, CA (US);
Robert K. Butler, Issaquah, WA (US)

(73) Assignee: National Semiconductor Corporation, Santa Clara, CA (US)

( * ) Notice: Subject to any disclaimer, the term of this patent is extended or adjusted under 35 U.S.C. 154(b) by 413 days.

(21) Appl. No.: 10/163,489

(22) Filed: Jun. 6, 2002

(51) Int. Cl.
*H04B 1/00* (2006.01)
*H04B 1/26* (2006.01)

(52) U.S. Cl. ............... 455/302; 455/318; 455/323; 455/326; 455/333

(58) Field of Classification Search ............ 455/302, 455/296, 303–309, 313–333
See application file for complete search history.

(56) References Cited

U.S. PATENT DOCUMENTS

| | | | |
|---|---|---|---|
| 5,303,417 A * | 4/1994 | Laws | 455/314 |
| 5,343,171 A * | 8/1994 | Fox et al. | 332/167 |
| 5,642,071 A * | 6/1997 | Sevenhans et al. | 327/359 |
| 5,787,126 A | 7/1998 | Itoh et al. | 375/340 |
| 5,862,466 A | 1/1999 | Erickson | 455/326 |
| 5,901,349 A * | 5/1999 | Guegnaud et al. | 455/302 |
| 6,035,186 A * | 3/2000 | Moore et al. | 455/313 |
| 6,073,001 A * | 6/2000 | Sokoler | 455/323 |
| 6,144,236 A | 11/2000 | Vice et al. | 327/113 |
| 6,144,845 A * | 11/2000 | Durec | 455/285 |
| 6,144,846 A * | 11/2000 | Durec | 455/323 |
| 6,208,875 B1 * | 3/2001 | Damgaard et al. | 455/552.1 |
| 6,324,388 B1 * | 11/2001 | Souetinov | 455/302 |
| 6,405,022 B1 * | 6/2002 | Roberts et al. | 455/76 |
| 6,542,724 B1 * | 4/2003 | Copeland et al. | 455/302 |
| 6,725,029 B1 * | 4/2004 | Allen | 455/302 |
| 6,959,179 B1 * | 10/2005 | Wong et al. | 455/324 |

* cited by examiner

*Primary Examiner*—Duc M. Nguyen

(57) ABSTRACT

A radio frequency (RF) demodulation circuit comprising a harmonic rejection mixing stage capable of receiving and mixing an incoming radio frequency (RF) signal having a frequency RF and a reference local oscillator (LO) signal having a frequency LO and generating an output signal in which out-of-band harmonic signals are suppressed. The harmonic rejection mixing stage comprises 1) a multiphase local oscillator (LO) generator for receiving the reference LO signal and generating M phase-shifted local oscillator signals having frequencies LO and 2) M mixers, each of the M mixers receiving the incoming radio frequency signal and one of the M phase-shifted local oscillator signals. Each of the M mixers generates a subcomponent signal. The subcomponent signals are then scaled and combined to produce the output signal.

34 Claims, 7 Drawing Sheets

HARMONIC REJECTION MIXER AND METHOD OF OPERATION

TECHNICAL FIELD OF THE INVENTION

The present invention is generally directed to radio frequency (RF) receivers and, in particular, to a harmonic rejection mixer.

BACKGROUND OF THE INVENTION

Business and consumers use a wide array of wireless devices, including cell phones, wireless local area network (LAN) cards, global positioning system (GPS) devices, electronic organizers equipped with wireless modems, and the like. The increased demand for wireless communication devices has created a corresponding demand for technical improvements to such devices. Generally speaking, more and more of the components of conventional radio receivers and transmitters are being fabricated in a single integrated circuit (IC) package. In particular, single chip radios with no off-chip channel filters are very popular. Direct conversion receivers and software-defined radios are being developed in order to simplify single chip designs and to make each design suitable for as many applications as possible.

In radio transceivers, mixers are widely used for translating signal frequencies. Mixing is an essential circuit process for all radio designs. It must exist regardless of the radio architecture. Conventional superheterodyne radios employ many mixers for translating radio frequency signals (RF) to intermediate frequency signals (IF) for signal amplification and filtering. Modern direct-conversion radios still require one mixing function for demodulating RF signals into baseband signals. The mixing process requires a local oscillator (LO). Depending on the type of radio architecture, the LO frequency can be higher, lower or equivalent to the RF frequency. The frequency difference equals either the IF or baseband frequencies.

There are two principal types of mixers: 1) the analog-multiplying mixer and 2) the switching mixer. An analog-multiplying mixer performs the basic multiplying function and the output is simply the product of two input signals. This method requires a linear multiplier to yield good spurious signal rejection performance. In modern integrated receivers, a switching mixer is more popular because of its simpler design, better signal linearity, and superior dynamic range. However, a major drawback of switching mixers is that the mixer output responds to odd harmonic frequencies of the local oscillator (LO) signal. This is an intrinsic characteristic of the design because the superior linearity relies on hard switching of the signal paths. Hard switching requires a harmonic-rich square wave signal source, which is the source of the unwanted responses.

Traditionally, multiple high-Q band-select filters have been utilized to provide the majority of suppression at these out-of-band harmonic frequencies. Special PCB pattern designs are also common practices to further enhance the suppression. Some designs even take advantage of the high frequency roll-off characteristic of the front-end low-noise amplifier (LNA) to further suppress the unwanted responses. In designing modern radio transceivers with stringent out-of-band specifications, the total available suppression from existing methods is always found to be inadequate. This condition worsens when higher transmitting frequencies are employed in newer radio standards, since common band-select filters exhibit poor rejection at higher frequencies. The advent of single-chip radios also fuels the degree of this problem. Ultimately, inadequate out-of-band harmonic suppression becomes a major roadblock in manufacturing high performance radios.

Therefore, there is a need in the art for an improved RF receiver architecture. In particular, there is a need in the art for an RF receiver architecture that has a simple design, improved signal linearity, and superior dynamic range. More particularly, there is a need for an RF receiver that provides a high degree of out-of-band harmonic suppression.

SUMMARY OF THE INVENTION

The present invention provides a harmonic rejection mixer that overcomes the problems inherent in the prior art. A harmonic rejection mixer (HRM) inserts nulls at harmonic frequencies to suppress unwanted responses. This technique is based on the frequency notching property of classical finite-impulse response (FIR) filters. The delay elements that are key to constructing FIR filters are taken from a multi-phase mixer array. Tightly controlling the phase matching of the multi-phase clock can produce accurate frequency nulls. The HRM retains the advantages of switching mixers and also provides superb suppression at harmonic frequencies. A harmonic rejection mixer is apt for single-chip radio applications.

To address the above-discussed deficiencies of the prior art, it is a primary object of an advantageous embodiment of the present invention to provide a radio frequency (RF) demodulation circuit comprising a harmonic rejection mixing stage capable of receiving and mixing an incoming radio frequency (RF) signal having a frequency RF and a reference local oscillator (LO) signal having a frequency LO and generating an output signal in which out-of-band harmonic signals are suppressed.

In one embodiment of the present invention, the harmonic rejection mixing stage comprises a multiphase local oscillator (LO) generator for receiving the reference LO signal and generating M phase-shifted local oscillator signals having frequencies LO.

In another embodiment of the present invention, the harmonic rejection mixing stage further comprises M mixers, each of the M mixers having a first input port for receiving said incoming radio frequency signal and a second input port for receiving one of the M phase-shifted local oscillator signals, wherein each of the M mixers generates a subcomponent output signal.

In still another embodiment of the present invention, the harmonic rejection mixing stage further comprises an amplitude scaling circuit for receiving M subcomponent output signals from said M mixers and generating M scaled subcomponent output signals.

In yet another embodiment of the present invention, the harmonic rejection mixing stage further comprises a summer circuit for summing said M scaled subcomponent output signals to produce a combined output signal.

The foregoing has broadly outlined the features and technical advantages of the present invention so that those skilled in the art may better understand the detailed description that follows. Additional features and advantages of the invention will be described below that form the subject of the claims of the invention. Those skilled in the art will appreciate that they may readily use the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it is advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, cooperate with, be proximate to, be bound to or with, have a property of, or the like. The term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 11, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged radio frequency (RF) receiver.

Figure 1:
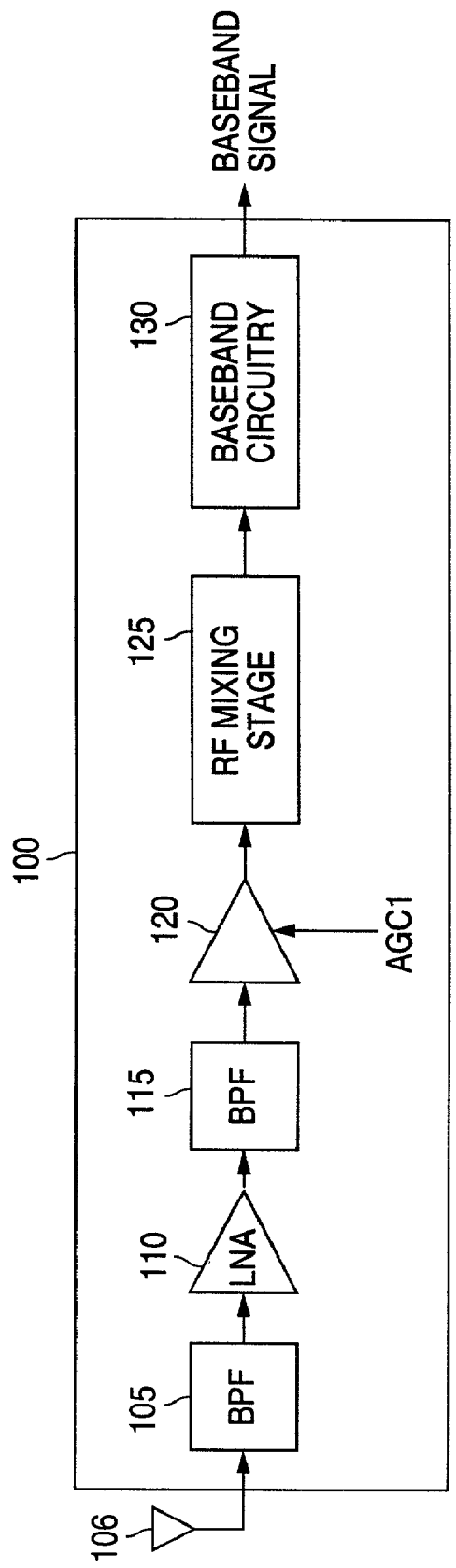
FIG. 1 illustrates selected portions of the receive signal path of an exemplary RF receiver according to one embodiment of the present invention.

FIG. 1 illustrates selected portions of the receive signal path of exemplary RF receiver 100 according to one embodiment of the present invention. RF receiver 100 may be implemented in any conventional one-way or two-way RF communication device, including a cell phone, a wireless network card, a two-way pager, and the like. For the purpose of simplifying the explanation of the present invention, the transmitter portion of a two-way communication embodiment of the present invention is not shown.

The RF receive path through RF receiver 100 comprises band pass filter (BPF) 105, which receives an incoming RF signal from antenna 106. The RF receive path further comprises low-noise amplifier (LNA) 110, band pass filter (BPF) 115, RF amplifier 120, RF mixing stage 125, and filters and AGC amplifiers block 130.

BPF 105 isolates the frequencies of interest in the incoming RF signal from antenna 106 and filters out unwanted frequency bands. LNA 110 amplifies the filtered output of BPF 105 to an intermediate level. BPF 115 further filters the amplified output of LNA 110 to remove noise outside of the desired receiver frequency range that were amplified by, or introduced by, LNA 110. RF amplifier 120 further amplifies the output of BPF 115 by a variable amount of gain determined by the gain control signal AGC1. According to the principles of the present invention, RF mixing stage 125 comprises a harmonic rejection mixer that down-converts the output of RF amplifier 120 by mixing it with a local oscillator reference signal. RF mixing stage 125 effectively shifts the information signal centered around the receiver RF operating frequency down to a baseband signal. Filters and AGC amplifiers block 130 comprises additional filtering circuitry and automatic gain control circuitry that further improve the quality of the baseband signal from RF mixing stage 125.

Those skilled in the art will recognize that, in alternate embodiments of the present invention, one or more of BPF 105 and BPF 115 may be other types of filters, including low pass filters. The choice of bandpass filters in the exemplary embodiment described above is by way illustration only and should not be construed so as to limit the scope of the present invention.

Figure 2B:
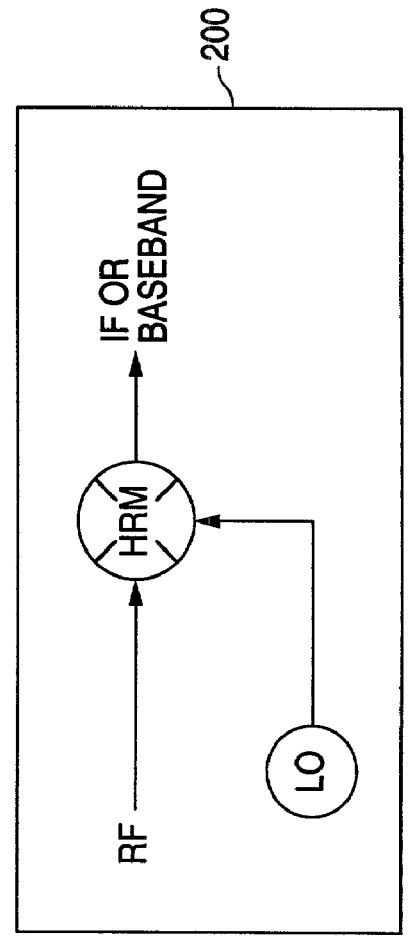
FIG. 2B is a simplified representation of an exemplary harmonic rejection mixer (HRM)
Figure 2A:
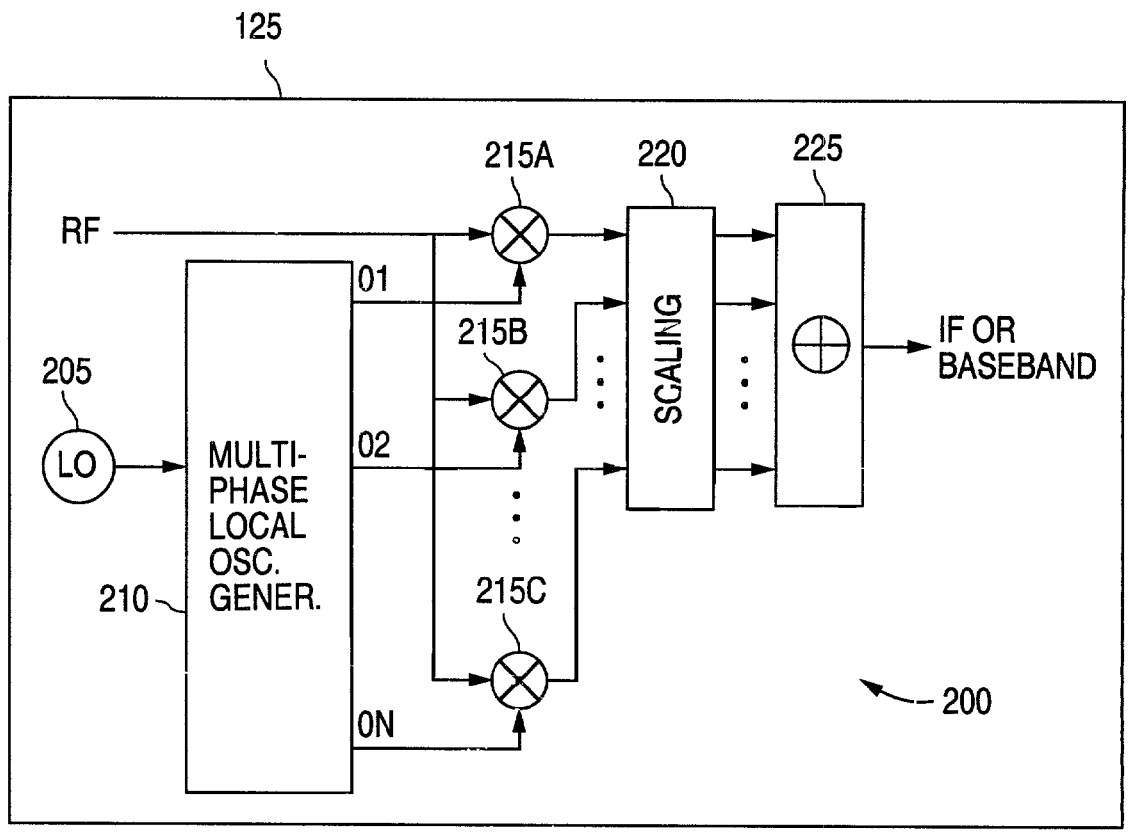
FIG. 2A illustrates a generic block diagram of a harmonic rejection mixer for use in the RF mixing stage of the RF receiver in FIG. 1 according to an exemplary embodiment of the present invention.

FIG. 2A illustrates a generic block diagram of harmonic rejection mixer 200 for use in RF mixing stage 125 according to an exemplary embodiment of the present invention.

FIG. 2B is a simplified representation of harmonic rejection mixer (HRM) 200. Harmonic rejection mixer (HRM) 200 comprises local oscillator 205, multiphase local oscillator generator 210, N radio frequency (RF) mixers 215, including exemplary RF mixers 215A, 215B, and 215C, scaling circuit 220, and summer 225. An HRM according to the principles of the present invention can be a direct drop-in replacement with enhanced performance for any conventional mixer. This includes applications in complex mixers, such as the image rejection mixer and the single-sideband mixer. Harmonic rejection mixer (HRM) 200 is architecturally compatible with any conventional mixer since the signal types required for driving the input and output ports are identical.

Harmonic rejection mixer (HRM) 200 receives an incoming RF signal and a local oscillator (LO) signal, and outputs an intermediate frequency (IF) signal or baseband signal. Multiphase local oscillator generator 210 receives the LO signal and generates N phase shifted copies of the LO signal, where the phase shifts are $\phi_1, \phi_2, \ldots$ and $\phi_n$, respectively. Each of the N phase-shifted LO signals is then mixed with the RF signal by RF mixers 215 to produce N down-converted IF signals or baseband signals. The N IF signals or baseband signals are then individually scaled by scaling circuit 220 and the scaled outputs are then combined by summer 225 to produce a final (or composite) IF signal or baseband signal.

When implementing high performance and high sensitivity radios, circuit designers face many design limiting factors when utilizing direct conversion or low-IF radio architectures. As a result, there is a trend to develop newer architectures utilizing a conventional superheterodyne approach, but with on-chip filters. These newer architectures are referred to as indirect or quasi-direct conversion architectures. One example is the cascading synchronous mixer.

A cascading synchronous mixer requires two cascading mixers to convert the RF signal to a baseband signal. It is noted that a simple direct-conversion radio still requires a level of mixing that is implemented with a dual channel IQ mixer. In single chip receivers, the cascading mixers require on-chip anti-alias filters placed in between the cascading mixers. Conventional approaches utilize off-chip surface acoustic wave (SAW) filters for this filtering function. The HRM design targets replacing these SAW filters.

Another application of harmonic rejection mixers according to the principles of the present invention is in the front-end mixing block. This block must exist in any radio or architecture, because there is always a minimum of one mixer in any design. The HRM has a similar function of suppressing mixer output due to the harmonic contents of the LO in both receiver applications, but harmonic frequencies can be different due to differences in LO frequencies.

In addition, harmonic rejection mixers according to the principles of the present invention are also applicable to upconverting mixers utilized in radio transmitters. Such an application alleviates the stringent requirement of the transmit filters, where nearby low-order harmonics (such as the 2nd and 3rd order harmonics) require large amount of suppression. A harmonic rejection mixer according to the present invention performs a similar function of suppressing mixer outputs due to the harmonic contents of the LO. The LO subsequently generates the RF transmitting frequency. If the transmitter utilizes several intermediate upconverting steps to achieve the final RF frequency, then several HRM mixers can be employed for these upconverting blocks and each HRM mixer can suppress the harmonic responses from its own LO.

Since the HRM performs similar functions in these applications, the following discussion focuses on receiving harmonic rejection. In particular, the receiving path has a cascading synchronous mixer architecture where all mixers are of the HRM type.

Figure 3:
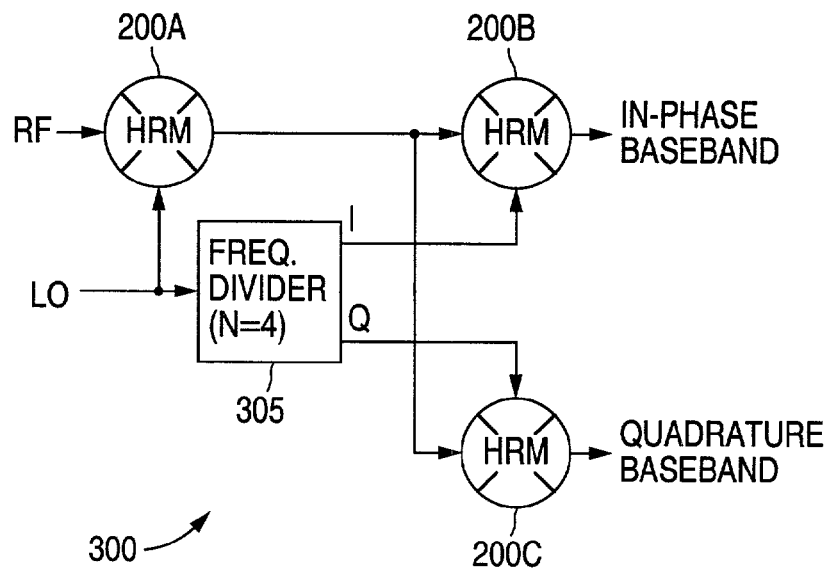
FIG. 3 illustrates an exemplary cascading synchronous mixer that uses harmonic rejection mixers according to the principles of the present invention.

FIG. 3 illustrates exemplary cascading synchronous mixer 300, which uses harmonic rejection mixers according to the principles of the present invention. Cascading synchronous mixer 300 comprises harmonic rejection mixers (HRM) 200, including exemplary HRM 200A, 200B and 200C, and frequency divider 305. There are two levels of mixing, and the second level consists of a dual channel IQ mixer. HRM 200A receives and mixes the incoming RF signal and the local oscillator (LO) signal to produce an intermediate frequency signal. Frequency divider 305 divides the frequency of the LO signal by a value N (e.g., N=4) to produce an in-phase (I) LO/N signal and a quadrature (Q) LO/N signal. HRM 200B receives and mixes the incoming intermediate frequency (IF) signal and the in-phase LO/N signal to produce an in-phase baseband signal. HRM 200C receives and mixes the incoming intermediate frequency (IF) signal and the quadrature LO/N signal to produce a quadrature baseband signal.

Since both IQ mixers (i.e., HRM 200B and 200C) exhibit the same frequency translation characteristics, these mixers can be represented by just one mixer for the purpose of harmonic frequency illustration. FIGS. 4A–4D illustrates such a one-mixer model for illustrating the frequency responses of cascading synchronous mixer 300 according to several embodiments of the present invention. There are four illustrations for different types of harmonic conditions. The numbers near the input/output ports of the mixers denote relative frequency values. These are normalized frequencies and are dimensionless (e.g., $\omega/\omega_0$).

Figure 4A:
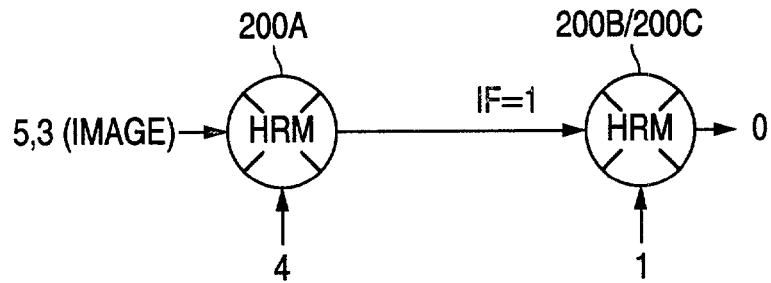
FIGS. 4A–4D illustrate the frequency responses of the exemplary cascading synchronous mixer in FIG. 3 according to several embodiments of the present invention.

FIG. 4A illustrates the targeted operating frequencies with RF frequency center=5, image frequency=3, first local oscillator frequency=4, second local oscillator frequency=1, and final baseband output 0.

Figure 4B:
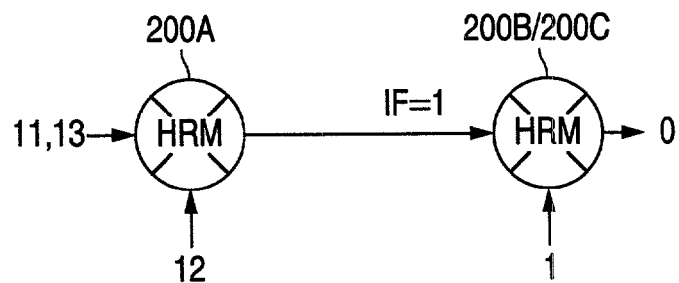

FIG. 4B illustrates the receiver responding to frequencies=11 and 13 when the first local oscillator exhibits 3rd harmonic content=12 (3×4). HRM 200A can suppress these unwanted responses.

Figure 4C:
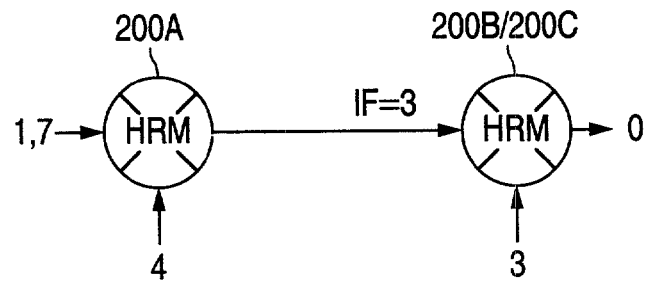

FIG. 4C illustrates the receiver responding to frequencies=1 and 7 when the second local oscillator exhibits 3rd harmonic content=3 (1×3). HRM 200B and HRM 200C can suppress these unwanted responses.

Figure 4D:
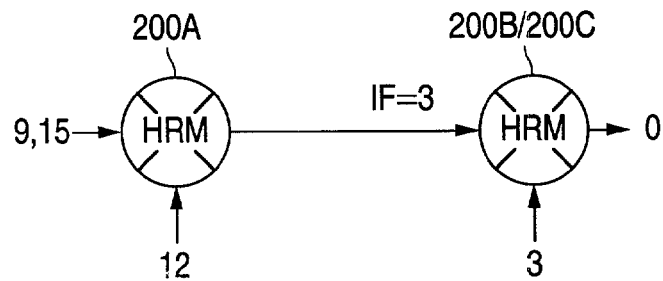

FIG. 4D illustrates the receiver responding to frequencies=9 and 15 when both the first and second local oscillators exhibit 3rd harmonic contents=12 and 3. HRM 200A can suppress these unwanted responses. HRM 200B and 200C enhance the suppression.

It is noted that physical mixers and LO sources exhibit multi-order harmonic distortions (both even and odd harmonics), whereas the above illustrations discussed only the 3rd harmonic. Moreover, modern radio specifications demand stringent requirements on these unwanted responses (e.g., 1, 7, 9, 11, 13 and 15 harmonics). For example, specifications ranging from 60 to 110 dB of minimum rejection are not uncommon. This amount of suppression is unavailable through common SAW filters or other on-chip filters, but requires harmonic rejection mixers instead.

Figure 5:
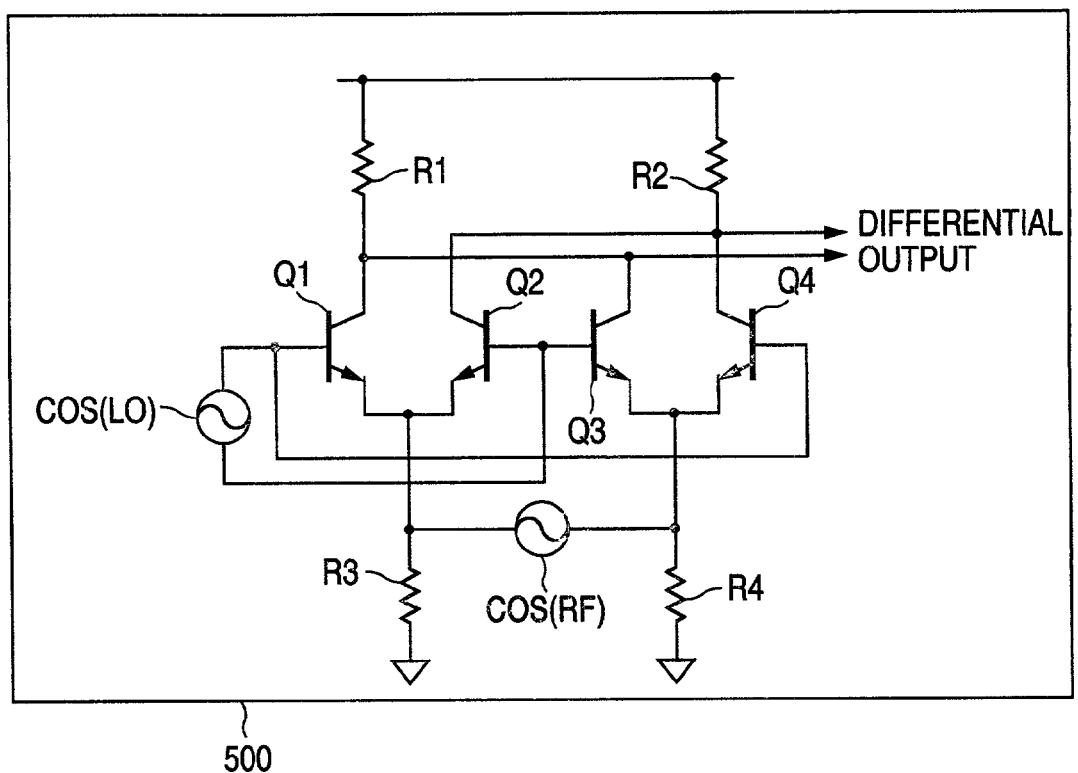
FIG. 5 illustrates a generic double-balanced switching mixer, which is suitable for use in a harmonic rejection mixer according to the principles of the present invention.

FIG. 5 illustrates generic double-balanced switching mixer 500, which is suitable for use in a harmonic rejection mixer according to the principles of the present invention. RF mixer 500 comprises NPN bias junction transistors (BJT) Q1, Q2, Q3, and Q4 and resistors R1, R2, R3, and R4. Transistors Q1 and Q2 form a first differential pair that receive the cos(LO) signal. The emitters of transistors Q1 and Q2 are coupled directly to each other and to ground via resistor R3. Transistors Q3 and Q4 form a second differential pair that receive the cos(LO) signal. The bases of transistors Q1 and Q4 are connected to the same differential output of the cos(LO) signal. The bases of transistors Q2 and Q3 are connected to the other differential output of the cos(LO) signal.

Resistor R1 is a load resistor that couples the collectors of transistors Q1 and Q3 to the positive power supply rail. Resistor R2 is a load resistor that couples the collectors of transistors Q2 and Q4 to the positive power supply rail. The emitters of transistors Q3 and Q4 are coupled to ground via resistor R4. The cos(RF) input is coupled between the junction of the emitters of transistors Q1 and Q2 and the junction of the emitters of transistors Q3 and Q4.

This class of mixers utilizes signal transfer switches (or transistors) to connect the RF input port to the IF output port. The mixing function is accomplished by reversing the output polarity of the two differential IF outputs at a rate equal to the LO frequency. Thus, in one embodiment, the LO port requires a square-wave signal which contains significant odd harmonic contents. However, a simple multiplying mixer requires a sine wave for driving the LO port. Ignoring the intrinsic non-linear distortion of the mixer, the mixer output has no response at the harmonic frequencies of the LO. This is simply due to the absence of harmonic content in any sine wave driving source.

A simple multiplying mixer follows the signal relationship:

$$\cos(\omega_{RF} t) * \cos(\omega_{LO} t) == \quad \text{EQN. 1}$$
$$0.5\cos[(\omega_{RF} \omega_{LO})t] + 0.5\cos[(\omega_{RF} + \omega_{LO})t]$$

where $\omega_{RF}$ is the RF frequency and $\omega_{LO}$ is the LO frequency.

In actual practice, $\omega_{RF}$ exhibits a band of frequencies which represent the full spectrum of the baseband modulation.

The first output term, $0.5 \cos[(\omega_{RF}-\omega_{LO}) t]$, denotes the IF output. When $\omega_{LO}=\omega_{RF}$, the output is in the baseband frequency, instead of the intermediate frequency (IF) range.

The second output term, $0.5 \cos[(\omega_{RF}+\omega_{LO}) t]$, denotes a high frequency output which does not contribute to the demodulation process. This term can be ignored for simplicity.

When there is a phase offset $\phi_{LO}$ applied to $\omega_{LO}$, the relationship becomes:

$$\cos(\omega_{RF} t + \phi_{RF}) * \cos(\omega_{LO} t + \phi_{LO}) == \quad \text{EQN. 2}$$
$$0.5\cos[(\omega_{RF} - \omega_{LO})t + (\phi_{RF} - \phi_{LO})] +$$
$$0.5\cos[(\omega_{RF} + \omega_{LO})t + (\phi_{RF} - \phi_{LO})]$$

where $\omega_{RF}$ is the RF frequency, $\omega_{LO}$ is the LO frequency, $\phi_{RF}$ is the RF phase offset, and $\phi_{LO}$ is the LO phase offset. Note that a harmonic rejection mixer uses this property to create signal delays for implementing finite impulse response (FIR) filtering functions.

The switching mixer approach requires a square wave signal source for driving the LO input. Since a square wave signal has substantial odd harmonic contents, the relationship (with 3rd and 5th harmonics added and $0.5 \cos[(\omega_{RF}+\omega_{LO})t+(\phi_{RF}+\phi_{LO})]$ terms omitted for simplicity) becomes:

$$\cos(\omega_{RF} t) * \{1.0\cos(A) + 0.33\cos(B) + 0.2\cos(C)\} \quad \text{EQN. 3}$$
$$\text{where } A = (1\omega_{LO} t + 1\phi), B = (3\omega_{LO} t + 3\phi), \text{ and}$$
$$C = (5\omega_{LO} t + 5\phi). \text{ This reduces to:}$$
$$= 1.0 * 0.5\cos[(\omega_{RF} - 1\omega_{LO})t - 1\phi] +$$
$$0.33 * 0.5\cos[(\omega_{RF} - 3\omega_{LO})t - 3\phi] +$$
$$0.2 * 0.5\cos[(\omega_{RF} - 5\omega_{LO})t - 5\phi]$$

A Harmonic Rejection mixer with N delay-taps can be expressed as (if one unit delay=$\pi/4$):

$$\sum_{n=1}^{K} \sum_{i=1}^{I} c_n h_i \cos[(\omega_{RF} i\omega_{LO})t + (n-1)(i\pi/4)] \quad \text{EQN. 4}$$

where $c_n$ is the tap coefficient of the nth delay-tap, $h_i$ is the magnitude of the ith harmonic of the LO signal, N is the total number of delay-taps, and I is the highest significant harmonic of the LO signal. Even harmonics must be included when magnitudes are significant.

The HRM mixer obtains its output by summing the tap outputs. Since the equations for each tap output contain cosine terms which can have positive and negative values, after summation, the final output at certain frequencies can be zero (equivalent to frequency null or transmission zero). By choosing appropriate values for N, $c_n$, and the unit delay size, a harmonic rejection mixer according to the principles of the present invention can suppress virtually any harmonic frequency. The limitation is the resolution of the physical delay step size.

A harmonic rejection mixer according to the present invention can be implemented in a differential configuration for high noise immunity. Using a calibrated delay line with a phase-locked loop (PLL) may provide excellent phase step and matching characteristics. Alternately, employing a high frequency clock pipeline can also ensure uniform phase steps. Finally, accurate scaling and summing can be achieved by applying current summing techniques. It is noted that a harmonic rejection mixer according to the present invention does not require breaking the connection between the two cascading mixers to insert an inter-stage filter. A direct replacement of existing mixer blocks with the HRM accomplishes the conversion.

In applying HRM mixers to a radio design, utilizing a quadrature clock source is more appropriate. This allows other system blocks to share the common clock resource. The final design would achieve higher performance and lower cost.

In most quadrature systems, the smallest clock phase increment is probably $\pi/2$ (90 degrees). An HRM with this coarse phase step can only provide nulls below the 2nd harmonic frequency. Finer phase step size is required to suppress higher order harmonics. A suitable compromise is to reduce the phase step size to $\pi/4$ (45 degrees).

Figure 6:
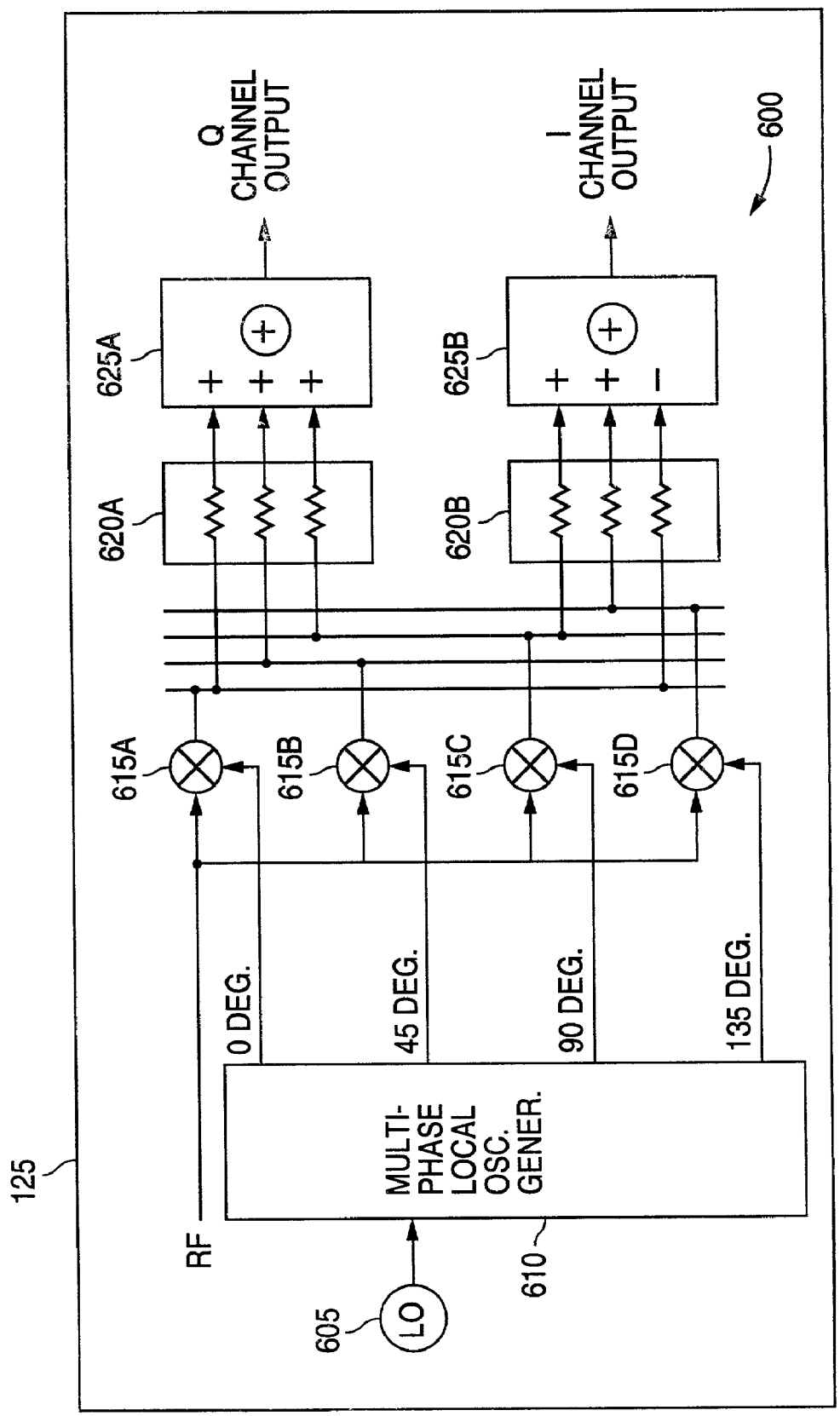
FIG. 6 illustrates an exemplary harmonic rejection mixer that implements a step size of 45 degrees according to an exemplary embodiment of the present invention.

FIG. 6 illustrates harmonic rejection mixer 600 that implements a step size of 45 degrees according to an exemplary embodiment of the present invention. Harmonic rejection mixer (HRM) 600 comprises local oscillator 605, multiphase local oscillator generator 610, radio frequency (RF) mixers 615A, 615B, 615C, and 615D, scaling circuits 620A and 620B, and summers 625A and 625B. RF mixers 615A, 615B, 615C, and 615D are switching mixers. Each of RF mixers 615A, 615B, 615C, and 615D has a LO input connected to one of the four phase-shifted output of multiphase local oscillator generator 610. The phase step size is $\pi/4$ (45 degrees). The outputs of these mixers are shared by a dual summing circuit (i.e., summers 625A and 625B) which has both an in-phase (I) output and a quadrature (Q) output. Each summing path has three scaled inputs. The scaling coefficients can be either positive or negative. Negative coefficients imply an inverted output from the mixer in actual hardware implementation.

There are many ways to select the scaling coefficients. Different combinations of coefficient values produce different suppression results. Setting the coefficient value to zero is also valid. This selection effectively removes a tap output.

FIGS. 7–11 illustrate the relative amplitude response (dB) versus frequency (Hz) for various coefficient selections according to the principles of the present invention. The vertical axis represents the relative amplitude response and the horizontal axis represents the frequency. All selection examples in FIGS. 7–11 are based on the quadrature circuit model of harmonic rejection mixer 600 shown in FIG. 6.

Figure 7:
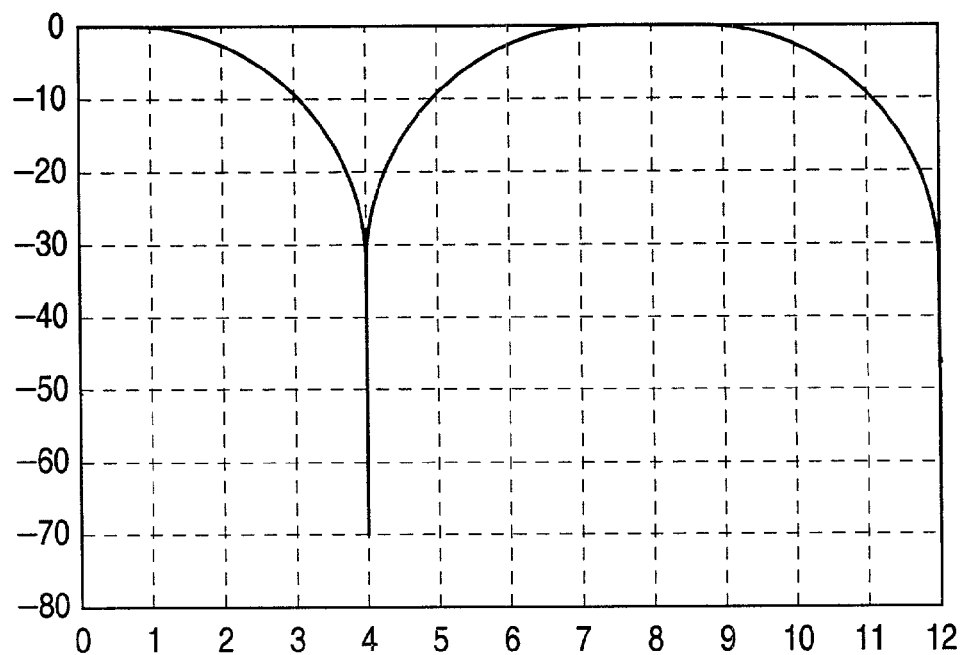
FIGS. 7–11 illustrate the relative amplitude response (dB) versus frequency (Hz) for various coefficient selections according to the principles of the present invention.
Figure 8:
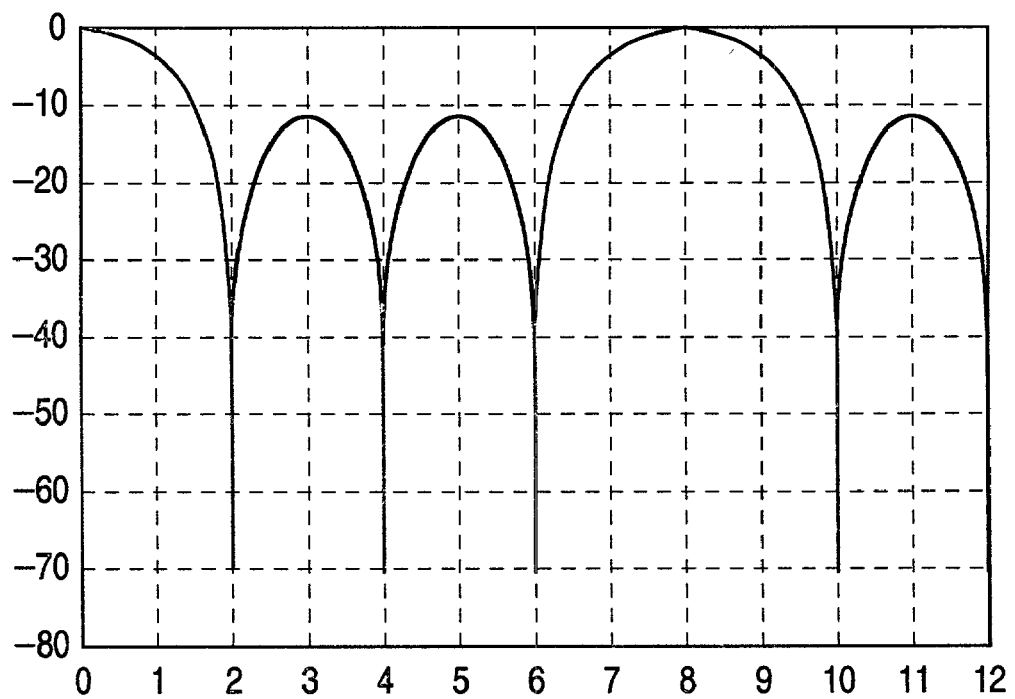

FIGS. 7 and 8 illustrate the response for two simple FIR filters, using two and four active taps, respectively, with all coefficients set to 1. The filter parameters for FIG. 7 are shown in TABLE 1 below:

TABLE 1

| Enable | Tap # | Coeff. | Delay |
|---|---|---|---|
| Yes | 1 | 1 | 0 |
| Yes | 2 | 1 | 1 |
| No | 3 | 0 | 2 |
| No | 4 | 0 | 3 |
| No | 5 | 0 | 4 |
| No | 6 | 0 | 5 |
| No | 7 | 0 | 6 |
| No | 8 | 0 | 7 |

The filter parameters for FIG. 8 are shown in TABLE 2 below:

TABLE 2

| Enable | Tap # | Coeff. | Delay |
|---|---|---|---|
| Yes | 1 | 1 | 0 |
| Yes | 2 | 1 | 1 |
| Yes | 3 | 1 | 2 |
| Yes | 4 | 1 | 3 |
| No | 5 | 0 | 4 |
| No | 6 | 0 | 5 |
| No | 7 | 0 | 6 |
| No | 8 | 0 | 7 |

The unit delay is $\pi/4$ or 45 degrees. In order for the LO frequency of harmonic rejection mixer to be 1 Hz, the unit delay is normalized to 1/8 of a second (i.e., 0.125 sec.). It is noted that the responses at integer multiples of one Hz (e.g., 2, 3, 4, . . . ) depict the 2nd, 3rd, 4th, . . . harmonic responses of the harmonic rejection mixer. Due to the pre-determined delay step size in a quadrature system, the filters in FIGS. 7 and 8 can have nulls only at even harmonics. FIG. 7 shows a null at 4 Hz and FIG. 8 shows nulls at 2 Hz, 4 Hz and 6 Hz. The delay step size also limits the maximum filter operating frequency, such that there is a frequency at 8 Hz (and multiples of 8 Hz) mirroring the filter response at 0 Hz.

It is noted that FIGS. 7 and 8 plot the response of a FIR filter instead of a harmonic rejection mixer. This allows a clearer presentation of the frequency characteristics of the harmonic rejection mixer. In actual practice, the harmonic rejection mixer does not behave exactly like an FIR filter where unwanted harmonic responses appear only at multiples of the LO frequency. This implies that the values not appearing at multiples of 1 Hz are not applicable to the harmonic rejection mixer (i.e., non-existing states). However, these FIR plots provide the user a better insight to the harmonic rejection mixer circuit sensitivity when circuit parameters vary.

The purpose of depicting the responses of the even harmonic filters in FIGS. 7 and 8 is to illustrate the relationship between the delay step size and the null frequencies. A more practical example for suppressing odd harmonics is shown in FIG. 9.

Figure 9:
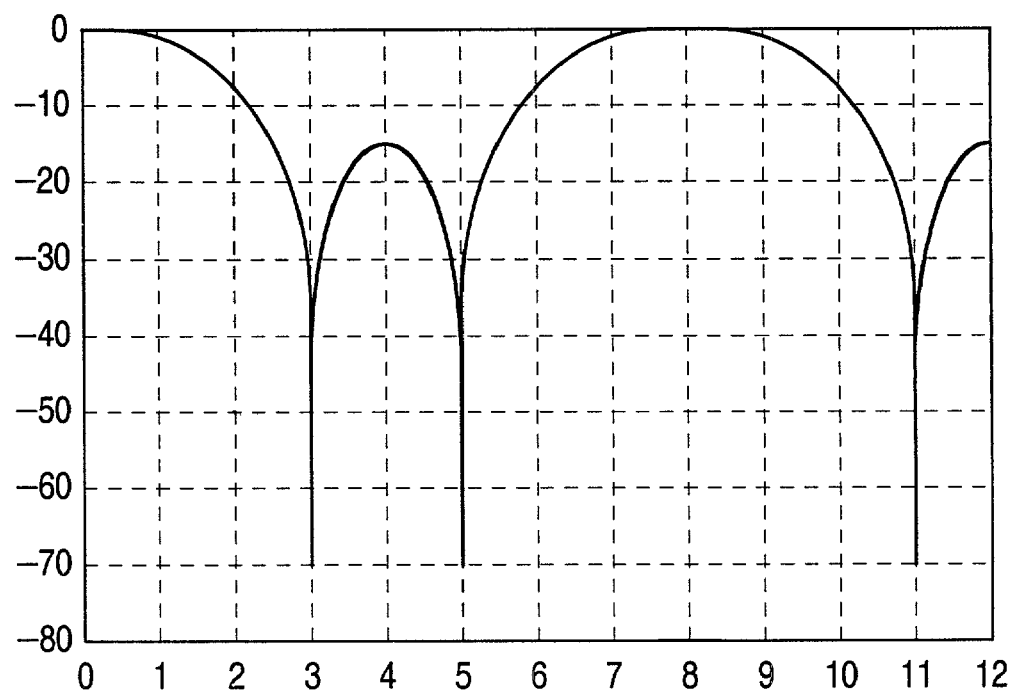

The harmonic rejection mixer parameters for FIG. 9 are shown in TABLE 3 below:

TABLE 3

| Enable | Tap # | Coeff. | Delay |
|---|---|---|---|
| Yes | 1 | 1 | 0 |
| Yes | 2 | 1.41421 | 1 |
| Yes | 3 | 1 | 2 |
| No | 4 | 0 | 3 |
| No | 5 | 0 | 4 |
| No | 6 | 0 | 5 |
| No | 7 | 0 | 6 |
| No | 8 | 0 | 7 |

The harmonic rejection mixer of FIG. 9 uses three taps and changes the coefficient value of the middle tap to 1.41421. The null frequencies change to 3 Hz and 5 Hz. Frequencies higher than 5 Hz can be attenuated more effectively by device roll-off or additional RC filters. This is perhaps the best compromising approach.

Figure 10:
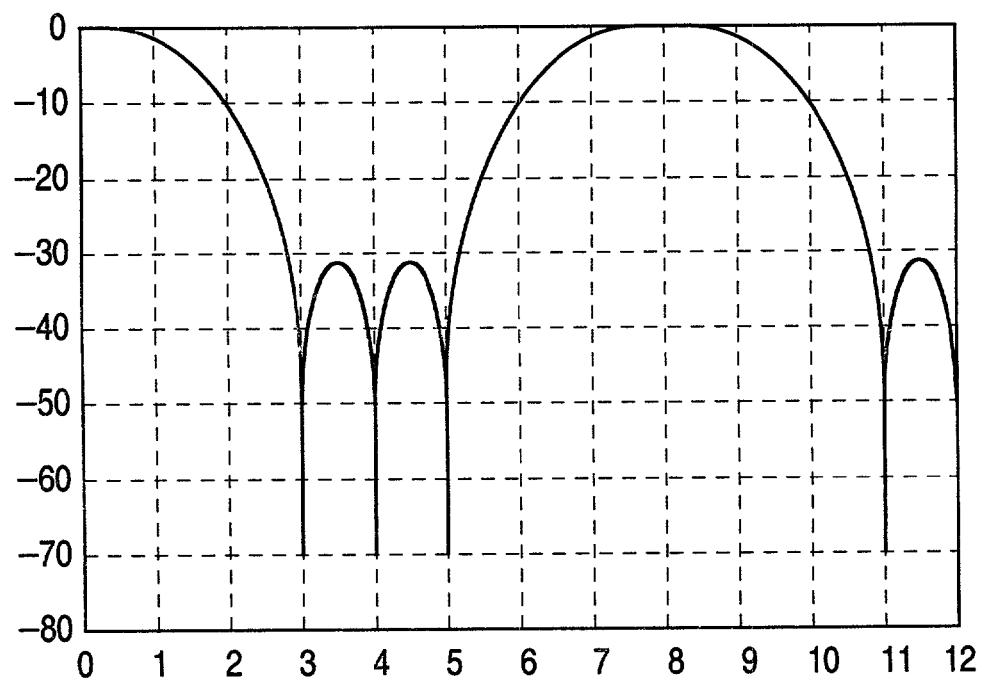
Figure 11:
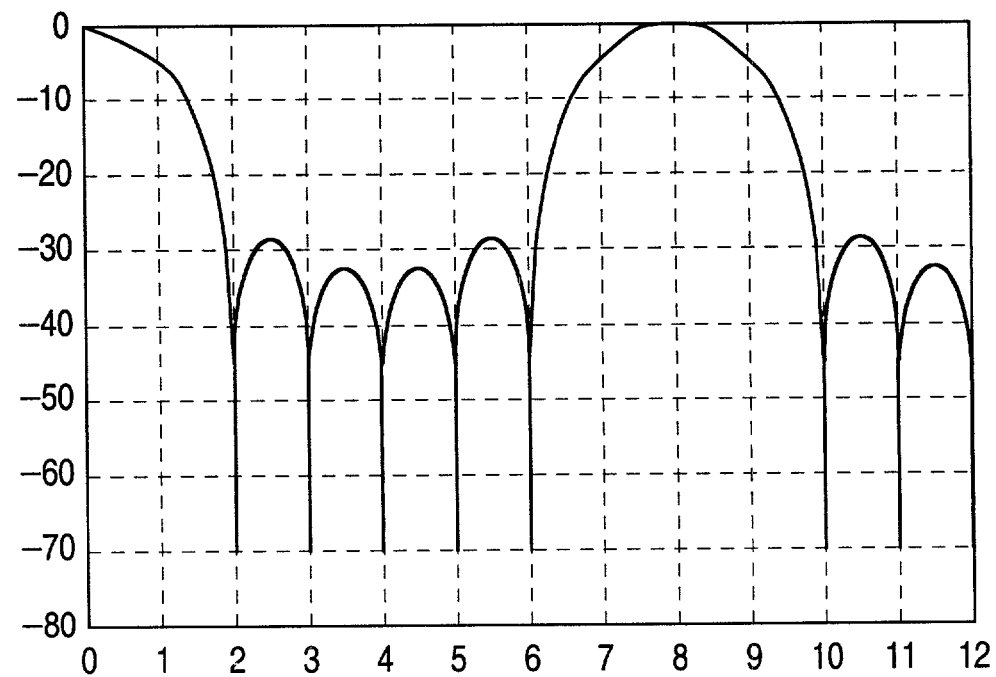

More complicated designs are shown in FIGS. 10 and 11.

The harmonic rejection mixer parameters for FIG. 10 are shown in TABLE 4 below:

TABLE 4

| Enable | Tap # | Coeff. | Delay |
|---|---|---|---|
| Yes | 1 | 1 | 0 |
| Yes | 2 | 2.41421 | 1 |
| Yes | 3 | 2.41421 | 2 |
| Yes | 4 | 1 | 3 |
| No | 5 | 0 | 4 |
| No | 6 | 0 | 5 |
| No | 7 | 0 | 6 |
| No | 8 | 0 | 7 |

The harmonic rejection mixer parameters for FIG. 11 are shown in TABLE 5 below:

TABLE 5

| Enable | Tap # | Coeff. | Delay |
|---|---|---|---|
| Yes | 1 | 1 | 0 |
| Yes | 2 | 2.41421 | 1 |
| Yes | 3 | 3.41421 | 2 |
| Yes | 4 | 3.41421 | 3 |
| Yes | 5 | 2.41421 | 4 |
| Yes | 6 | 1 | 5 |
| No | 7 | 0 | 6 |
| No | 8 | 0 | 7 |

Although FIGS. 10 and 11 show additional nulls at several even harmonic frequencies, these approaches are not cost effective. In theory, a well-balanced mixer creates insignificant even harmonic distortions and there is no need for harmonic rejection mixer or equivalent to enhance the suppression. On the contrary, an unbalanced or poorly matched harmonic rejection mixer performs poorly in suppressing any of the harmonics. Thus, the approach shown in FIG. 9 is a sufficient design. In addition, the designs in FIGS. 10 and 11 require additional scaled inputs (four and six respectively, instead of three) for each summing circuit, while the latter requires additional mixers for replacing the use of the inverted mixer outputs as shown in FIG. 6.

Out-of-band harmonic frequency suppression is a mandatory requirement in designing state-of-the-art radios. It is no longer a luxury feature that applies only to high-performance radios. Radio designers must combine all available suppression methods to achieve the requirement with margin. Unfortunately, the advent of single-chip radios prevents the radio designers from utilizing off-chip SAW filters which are perhaps the most-effective means to meet these requirements.

The harmonic rejection mixer according to the principles of the present invention is similar to most image-rejection mixing or complex filtering devices. It uses vector cancellation to achieve signal rejection. The present invention uses two (or more) equal vectors to produce a zero output. Therefore, its performance is sensitive to component matching and delay accuracy. Fortunately, a harmonic rejection mixer according to the present invention has the shortest signal path (least components) within the cancellation loop of any of these canceling methods. Using modern circuit matching techniques, an uncalibrated HRM can achieve a minimum of 40 dB harmonic suppression. The HRM is apt for single-chip radio applications, both in the receiving and transmitting paths.

Although the present invention has been described in detail, those skilled in the art should understand that they can make various changes, substitutions and alterations herein without departing from the spirit and scope of the invention in its broadest form.

What is claimed is:

1. A radio frequency (RF) demodulation circuit comprising:
   a first harmonic rejection mixing stage capable of receiving and mixing an incoming radio frequency (RF) signal having a frequency RF and a reference local oscillator (LO) signal having a frequency LO and generating therefrom a composite intermediate frequency (IF) signal having a frequency IF1;
   a frequency divider for receiving said reference local oscillator signal and generating an in-phase local oscillator signal and a quadrature local oscillator signal both having a frequency LO/N; and
   a second harmonic rejection mixing stage for receiving said composite intermediate frequency (IF) signal having a frequency IF1 and said in-phase local oscillator signal having a frequency LO/N and generating therefrom an in-phase output signal in which out-of-band harmonic signals are suppressed;
   wherein at least one of the first and second harmonic rejection mixing stages comprises: an RF signal input, an LO signal input, an IF signal output for providing the composite IF signal as differential outputs, and a plurality of signal transfer switches capable of connecting the RF signal input to the IF signal output and reversing a polarity of the differential outputs based on the frequency LO, the at least one of the first and second harmonic rejection mixing stages having a frequency response including nulls at one or more harmonics of the LO signal input.

2. The radio frequency demodulation circuit as set forth in claim 1 wherein said first harmonic rejection mixing stage comprises a first multiphase local oscillator (LO) generator for receiving said reference LO signal and generating therefrom M phase-shifted local oscillator signals having frequencies LO.

3. The radio frequency demodulation circuit as set forth in claim 2 wherein said first harmonic rejection mixing stage further comprises M mixers, each of said M mixers having a first input port for receiving said incoming radio frequency signal and a second input port for receiving one of said M phase-shifted local oscillator signals, wherein each of said M mixers generates an intermediate frequency (IF) signal having a frequency IF1.

4. The radio frequency demodulation circuit as set forth in claim 3 wherein said first harmonic rejection mixing stage further comprises an amplitude scaling circuit for receiving M intermediate frequency signals from said M mixers and generating M scaled intermediate frequency signals.

5. The radio frequency demodulation circuit as set forth in claim 4 wherein said first harmonic rejection mixing stage further comprises a summer circuit for summing said M scaled intermediate frequency signals to produce said composite intermediate frequency signal.

6. The radio frequency demodulation circuit as set forth in claim 5 wherein said second harmonic rejection mixing stage comprises a second multiphase local oscillator (LO) generator for receiving said in-phase local oscillator signal having a frequency LO/N and generating therefrom P phase-shifted local oscillator signals having frequencies LO/N.

7. The radio frequency demodulation circuit as set forth in claim 6 wherein said second harmonic rejection mixing stage further comprises P mixers, each of said P mixers having a first input port for receiving said composite intermediate frequency (IF) signal having a frequency IF1 and a second input port for receiving one of said P phase-shifted local oscillator signals, wherein each of said P mixers generates an intermediate frequency (IF) signal having a frequency IF2.

8. The radio frequency demodulation circuit as set forth in claim 7 wherein said second harmonic rejection mixing stage further comprises an amplitude scaling circuit for receiving P intermediate frequency signals from said P mixers and generating P scaled intermediate frequency signals.

9. The radio frequency demodulation circuit as set forth in claim 8 wherein said second harmonic rejection mixing stage further comprises a summer circuit for summing said P scaled intermediate frequency signals to produce said in-phase output signal in which out-of-band harmonic signals are suppressed.

10. The radio frequency demodulation circuit as set forth in claim 1 wherein said radio frequency demodulation circuit further comprises a third harmonic rejection mixing stage for receiving said composite intermediate frequency (IF) signal having a frequency IF1 and said quadrature local oscillator signal having a frequency LO/N and generating therefrom a quadrature output signal in which out-of-band harmonic signals are suppressed.

11. The radio frequency demodulation circuit as set forth in claim 10 wherein said third harmonic rejection mixing stage comprises a third multiphase local oscillator (LO) generator for receiving said quadrature local oscillator signal having a frequency LO/N and generating therefrom R phase-shifted local oscillator signals having frequencies LO/N.

12. The radio frequency demodulation circuit as set forth in claim 11 wherein said third harmonic rejection mixing stage further comprises R mixers, each of said R mixers having a first input port for receiving said composite intermediate frequency (IF) signal having a frequency IF1 and a second input port for receiving one of said R phase-shifted local oscillator signals, wherein each of said R mixers generates an intermediate frequency (IF) signal having a frequency IF2.

13. The radio frequency demodulation circuit as set forth in claim 12 wherein said third harmonic rejection mixing stage further comprises an amplitude scaling circuit for receiving R intermediate frequency signals from said R mixers and generating R scaled intermediate frequency signals.

14. The radio frequency demodulation circuit as set forth in claim 13 wherein said third harmonic rejection mixing stage further comprises a summer circuit for summing said R scaled intermediate frequency signals to produce said quadrature output signal in which out-of-band harmonic signals are suppressed.

15. The radio frequency demodulation circuit as set forth in claim 1, wherein the plurality of signal transfer switches comprises:
   a first differential transistor pair comprising a first transistor and a second transistor; and
   a second differential transistor pair comprising a third transistor and a fourth transistor;
   wherein emitters of the first and second transistors are coupled to each other and to ground;
   wherein emitters of the third and fourth transistors are coupled to each other and to ground;
   wherein the incoming RF signal comprises a pair of RF differential signals received at the RF signal input, one of the RF differential signals provided to the emitters of the first and second transistors, another of the RF differential signals provided to the emitters of the third and fourth transistors;
   wherein the reference LO signal comprises a pair of LO differential signals received at the LO signal input, one of the LO differential signals provided to bases of the first and fourth transistors, another of the LO differential signals provided to bases of the second and third transistors; and
   wherein collectors of the first and third transistors provide one of the differential outputs and collectors of the second and fourth transistors provide another of the differential outputs.

16. A radio frequency (RF) receiver comprising:
   a receiver front-end circuit capable of receiving an incoming RF signal from an antenna and filtering and amplifying said incoming RF signal; and
   a radio frequency (RF) demodulation circuit comprising:
      a first harmonic rejection mixing stage capable of receiving and mixing an incoming radio frequency (RF) signal having a frequency RF and a reference local oscillator (LO) signal having a frequency LO and generating therefrom a composite intermediate frequency (IF) signal having a frequency IF1;
      a frequency divider for receiving said reference local oscillator signal and generating an in-phase local oscillator signal and a quadrature local oscillator signal both having a frequency LO/N; and
      a second harmonic rejection mixing stage for receiving said composite intermediate frequency (IF) signal having a frequency IF 1 and said in-phase local oscillator signal having a frequency LO/N and generating therefrom an in-phase output signal in which out-of-band harmonic signals are suppressed;
      wherein at least one of the first and second harmonic rejection mixing stages comprises: an RF signal input, an LO signal input, an IF signal output for providing the composite IF signal as differential outputs, and a plurality of signal transfer switches capable of connecting the RF signal input to the IF signal output and reversing a polarity of the differential outputs based on the frequency LO, the at least one of the first and second harmonic rejection mixing stages having a frequency response including nulls at one or more harmonics of the LO signal input.

17. The radio frequency (RF) receiver as set forth in claim 16 wherein said first harmonic rejection mixing stage comprises a first multiphase local oscillator (LO) generator for receiving said reference LO signal and generating therefrom M phase-shifted local oscillator signals having frequencies LO.

18. The radio frequency (RF) receiver as set forth in claim 17 wherein said first harmonic rejection mixing stage further comprises M mixers, each of said M mixers having a first input port for receiving said incoming radio frequency signal and a second input port for receiving one of said M phase-shifted local oscillator signals, wherein each of said M mixers generates an intermediate frequency (IF) signal having a frequency IF1.

19. The radio frequency (RF) receiver as set forth in claim 18 wherein said first harmonic rejection mixing stage further comprises an amplitude scaling circuit for receiving M intermediate frequency signals from said M mixers and generating M scaled intermediate frequency signals.

20. The radio frequency (RF) receiver as set forth in claim 19 wherein said first harmonic rejection mixing stage further comprises a summer circuit for summing said M scaled intermediate frequency signals to produce said composite intermediate frequency signal.

21. The radio frequency (RF) receiver as set forth in claim 20 wherein said second harmonic rejection mixing stage comprises a second multiphase local oscillator (LO) generator for receiving said in-phase local oscillator signal having a frequency LO/N and generating therefrom P phase-shifted local oscillator signals having frequencies LO/N.

22. The radio frequency (RF) receiver as set forth in claim 21 wherein said second harmonic rejection mixing stage further comprises P mixers, each of said P mixers having a first input port for receiving said composite intermediate frequency (IF) signal having a frequency IF1 and a second input port for receiving one of said P phase-shifted local oscillator signals, wherein each of said P mixers generates an intermediate frequency (IF) signal having a frequency IF2.

23. The radio frequency (RF) receiver as set forth in claim 22 wherein said second harmonic rejection mixing stage further comprises an amplitude scaling circuit for receiving P intermediate frequency signals from said P mixers and generating P scaled intermediate frequency signals.

24. The radio frequency (RF) receiver as set forth in claim 23 wherein said second harmonic rejection mixing stage further comprises a summer circuit for summing said P scaled intermediate frequency signals to produce said in-phase output signal in which out-of-band harmonic signals are suppressed.

25. The radio frequency (RF) receiver as set forth in claim 16 wherein said radio frequency demodulation circuit further comprises a third harmonic rejection mixing stage for receiving said composite intermediate frequency (IF) signal having a frequency IF1 and said quadrature local oscillator signal having a frequency LO/N and generating therefrom a quadrature output signal in which out-of-band harmonic signals are suppressed.

26. The radio frequency (RF) receiver as set forth in claim 25 wherein said third harmonic rejection mixing stage comprises a third multiphase local oscillator (LO) generator for receiving said quadrature local oscillator signal having a frequency LO/N and generating therefrom R phase-shifted local oscillator signals having frequencies LO/N.

27. The radio frequency (RF) receiver as set forth in claim 26 wherein said third harmonic rejection mixing stage further comprises R mixers, each of said R mixers having a first input port for receiving said composite intermediate frequency (IF) signal having a frequency IF1 and a second input port for receiving one of said R phase-shifted local oscillator signals, wherein each of said R mixers generates an intermediate frequency (IF) signal having a frequency IF2.

28. The radio frequency (RF) receiver as set forth in claim 27 wherein said third harmonic rejection mixing stage further comprises an amplitude scaling circuit for receiving R intermediate frequency signals from said R mixers and generating R scaled intermediate frequency signals.

29. The radio frequency (RF) receiver as set forth in claim 28 wherein said third harmonic rejection mixing stage further comprises a summer circuit for summing said R scaled intermediate frequency signals to produce said quadrature output signal in which out-of-band harmonic signals are suppressed.

30. A radio frequency (RF) demodulation circuit comprising:
  a first harmonic rejection mixing stage capable of receiving and mixing an incoming radio frequency (RF) signal and a reference local oscillator (LO) signal and generating therefrom an intermediate signal;
  a frequency divider capable of receiving the reference local oscillator signal and generating an in-phase local oscillator signal and a quadrature local oscillator signal;
  a second harmonic rejection mixing stage capable of receiving the intermediate signal and the in-phase local oscillator signal and generating therefrom an in-phase output signal; and
  a third harmonic rejection mixing stage capable of receiving the intermediate signal and the quadrature local oscillator signal and generating therefrom a quadrature output signal;
  wherein at least one of the first and second harmonic rejection mixing stages comprises: an RF signal input, an LO signal input, an IF signal output for providing the composite IF signal as differential outputs, and a plurality of signal transfer switches capable of connecting the RF signal input to the IF signal output and reversing a polarity of the differential outputs based on the frequency LO, the at least one of the first and second harmonic rejection mixing stages having a frequency response including nulls at one or more harmonics of the LO signal input.

31. The radio frequency demodulation circuit as set forth in claim 30 wherein said first harmonic rejection mixing stage comprises a multiphase local oscillator (LO) generator for receiving said reference LO signal and generating therefrom M phase-shifted local oscillator signals having frequencies LO.

32. The radio frequency demodulation circuit as set forth in claim 31 wherein said first harmonic rejection mixing stage further comprises M mixers, each of said M mixers having a first input port for receiving said incoming radio frequency signal and a second input port for receiving one of said M phase-shifted local oscillator signals, wherein each of said M mixers generates a subcomponent output signal.

33. The radio frequency demodulation circuit as set forth in claim 32 wherein said first harmonic rejection mixing stage further comprises an amplitude scaling circuit for receiving M subcomponent output signals from said M mixers and generating M scaled subcomponent output signals.

34. The radio frequency demodulation circuit as set forth in claim 33 wherein said harmonic rejection mixing stage further comprises a summer circuit for summing said M scaled subcomponent output signals to produce said intermediate signal.

* * * * *